(12) United States Patent
Kihara et al.

(10) Patent No.: US 8,957,721 B2
(45) Date of Patent: Feb. 17, 2015

(54) LEVEL SHIFT CIRCUIT

(75) Inventors: Seiichiro Kihara, Osaka (JP); Shunichi Utsumi, Kobe (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/345,452

(22) PCT Filed: Jul. 27, 2012

(86) PCT No.: PCT/JP2012/069103
§ 371 (c)(1),
(2), (4) Date: Mar. 18, 2014

(87) PCT Pub. No.: WO2013/046898
PCT Pub. Date: Apr. 4, 2013

(65) Prior Publication Data
US 2014/0347116 A1 Nov. 27, 2014

(30) Foreign Application Priority Data
Sep. 30, 2011 (JP) ................. 2011-216162

(51) Int. Cl.
*H03L 5/00* (2006.01)
*H03K 3/013* (2006.01)
(Continued)

(52) U.S. Cl.
CPC .............. *H03K 3/013* (2013.01); *H03K 3/356* (2013.01); *H03K 19/018507* (2013.01); *H03K 19/0013* (2013.01)
USPC .......................................................... 327/333

(58) Field of Classification Search
USPC .......................................................... 327/333
See application file for complete search history.

(56) References Cited

U.S. PATENT DOCUMENTS 6,326,831 B1 12/2001 Kumagai
8,615,062 B2 * 12/2013 Chmelar ....................... 375/350
(Continued)

FOREIGN PATENT DOCUMENTS

JP 09200020 7/1997
JP 2000-252809 A 9/2000
(Continued)

OTHER PUBLICATIONS

International Search Report PCT/ISA/210 for International Application No. PCT/JP2012/069103 Dated Aug. 22, 2012.

*Primary Examiner* — Adam Houston
(74) *Attorney, Agent, or Firm* — Harness, Dickey & Pierce, P.L.C.

(57) ABSTRACT

The present invention provides a level shift circuit having low possibility of malfunction by noise, and can operate with low power. A level shift circuit 1 includes first and second MOSFETs 12a and 12b using signals with phases same as and opposite to the phase of an input signal Sin as gate inputs, first and second resistance elements 13a and 13b, each having one end connected to a shift level power terminal that supplies high-level output voltage of a level-shifted output signal, and each having the other end connected to a corresponding drain of the first and second MOSFETs, a comparator 14 having a pair of differential input terminals, which are individually connected to respective drains of the first and second MOSFETs, and a current control circuit 16 that controls an amount of first current flowing through the first MOSFET via the first resistance element and an amount of second current flowing through the second MOSFET via the second resistance element in synchronization with a rising and a falling of a signal level of the input signal.

4 Claims, 10 Drawing Sheets

(51) Int. Cl.
*H03K 3/356* (2006.01)
*H03K 19/0185* (2006.01)
*H03K 19/00* (2006.01)

(56) References Cited

U.S. PATENT DOCUMENTS

| | | | |
|---|---|---|---|
| 8,823,426 B2* | 9/2014 | Song | 327/115 |
| 2002/0014905 A1 | 2/2002 | Kumagai | |
| 2005/0084046 A1* | 4/2005 | Seo | 375/350 |
| 2009/0167750 A1* | 7/2009 | Hong et al. | 345/213 |
| 2010/0241918 A1* | 9/2010 | Nedovic | 714/746 |
| 2011/0115542 A1 | 5/2011 | Koike | |
| 2011/0150060 A1* | 6/2011 | Huang et al. | 375/224 |
| 2013/0202064 A1* | 8/2013 | Chmelar | 375/340 |
| 2014/0097876 A1* | 4/2014 | Yamashiro | 327/109 |
| 2014/0111256 A1* | 4/2014 | Song | 327/115 |

FOREIGN PATENT DOCUMENTS

| | | |
|---|---|---|
| JP | 2003-179482 A | 6/2003 |
| JP | 2011-109843 A | 6/2011 |

* cited by examiner

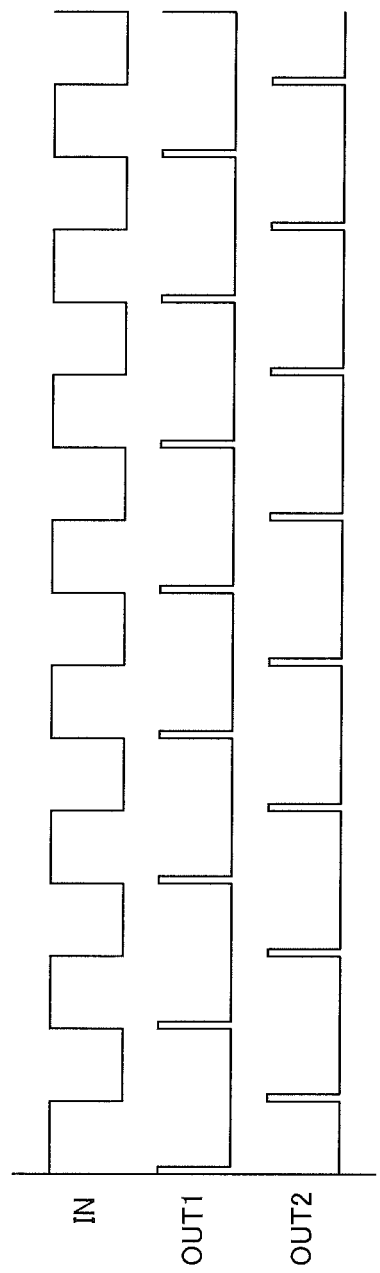

LEVEL SHIFT CIRCUIT

TECHNICAL FIELD

The present invention relates to a level shift circuit, and more particularly to a circuit that converts a voltage level of a control signal, which controls a half-bridged switching element such as MOSFET, IGBT, SiCFET, or GaNFET used mainly in an inverter circuit, to an appropriate level for the control.

BACKGROUND ART

An inverter system that can realize a control with a high level by a microcontroller has widely been used for a control of a motor used in home electric appliances, such as an air-conditioner or a refrigerator, in order to enhance energy-saving performance, and an IPM (Intelligent Power Module) formed by packaging the switching element and its driver IC has widely been used for an inverter circuit that realizes the inverter system. As a wide bandgap semiconductor element such as SiCFET or GaNFET has been put into practical use, the incorporation of such wide bandgap semiconductor element into the IPM has been studied in order to enhance efficiency brought by low on-resistance and high-frequency characteristic of such wide bandgap semiconductor element.

FIG. 8 illustrates an example of a circuit structure of a conventional inverter circuit. FIG. 8 illustrates an example of a structure of an inverter circuit employing an IPM including a driver IC 30, n-type MOSFETs 7a and 7b, a diode 8, and a capacitor 9. The driver IC 30 has a function of a level shift circuit.

The driver IC 30 includes a power terminal Vcc and a ground terminal Vss which are externally supplied, a control input terminal Inh of a high-side circuit 36, a control input terminal Inl on a low-side, a positive voltage power terminal Vb, a reference power terminal Vs, and an output terminal Vh of the high-side circuit 36, and an output terminal Vl on the low-side. The power terminal Vcc and the ground terminal Vss of the driver IC 30 are connected respectively to a power terminal VCC and a ground terminal VSS of the IPM.

A control input signal of the high-side circuit 36 inputted from the control input terminal Inh is connected to an input terminal IN of a pulse generating circuit 31. A first control pulse with a pulse width of about 100 ns is generated from a first output terminal OUT1 after a rising of the control input signal, while a second control pulse with a pulse width of about 100 ns is generated from a second output terminal OUT2 after a falling of the control input signal.

FIG. 9 illustrates an example of a circuit structure of the pulse generating circuit 31. The pulse generating circuit 31 includes six cascade-connected inverters 41a, 41b, 41c, 41d, 41e, and 41f, two NAND circuits 42a and 42b, two inverters 43a and 43b, and two capacitors 44a and 44b for setting a pulse width. An input of the head inverter 41a is connected to the input terminal IN. When an output node of each of the inverters 41a, 41b, 41c, 41d, 41e, and 41f is defined as N1, N2, N3, N4, N5, and N6 in order from head to tail, one end of each of the capacitors 44a and 44b is grounded, the other ends of the capacitors 44a and 44b are connected to the nodes N3 and N4 respectively, the nodes N2 and N5 are connected to two inputs of the NAND circuit 42a respectively, the nodes N1 and N6 are connected to two inputs of the NAND circuit 42b respectively, outputs of the NAND circuits 42a and 42b are connected to inputs of the inverters 43a and 43b respectively, and outputs of the inverters 43a and 43b are connected to output terminals OUT1 and OUT2 respectively.

FIG. 10 illustrates an operation waveform of the pulse generating circuit 31. The first pulse in synchronization with the rising of the control input signal inputted to the input terminal IN is outputted from the first output terminal OUT1, while the second pulse in synchronization with the falling of the control input signal is outputted from the second output terminal OUT2.

The first pulse is inputted to a gate of the n-type MOSFET 32a, is converted into a signal whose level is shifted by a resistance 33a, and is inputted to a reset input R of an RS flip-flop 34. The second pulse is inputted to a gate of the n-type MOSFET 32b, is converted into a signal whose level is shifted by a resistance 33b, and is inputted to a set input S of the RS flip-flop 34. An output Q of the RS flip-flop 34 is connected to an input of an inverter 35, and an output of the inverter 35 is connected to a gate of a MOSFET 7a via an output terminal Vh.

As a result, the control input signal inputted to the control input terminal Inh is transmitted to the high-side circuit 36, which is floating, with its level being shifted, and is outputted to the gate of the MOSFET 7a as a high-side output signal. On the other hand, the control input signal on the low-side inputted to the control input terminal Inl on the low-side is outputted to the gate terminal of the MOSFET 7b via the output terminal Vl on the low-side.

A high-voltage power supply of about 600 V is connected to a drain of the MOSFET 7a via a high-voltage power terminal HV in the IPM, for example. The source of the MOSFET 7a and the drain of the MOSFET 7b are connected to the reference power terminal Vs of the driver IC 30 and an output terminal OUT of the IPM. The source of the MOSFET 7b is connected to an output ground terminal GND of the IPM to be grounded.

One end of the capacitor 9 is connected to a cathode terminal of the diode 8 and the positive-voltage power terminal Vb, the other end of the capacitor 9 is connected to the reference power terminal Vs, and an anode terminal of the diode 8 is connected to the power terminal Vcc. The diode 8 and the capacitor 9 constitute a bootstrap circuit. When the power-supply voltage supplied via the power terminal VCC of the IPM connected to the power terminal Vcc is charged to the floating capacitor 9, and the potential of the reference power terminal Vs rises via the MOSFET 7a, a high voltage is generated on the positive voltage power terminal Vb by capacitive coupling via the capacitor 9, whereby floating electric supply to the high-side circuit 36 is realized.

When two control input signals having opposite phases, are inputted to the control input terminals Inh and Inl respectively, an output signal having the high voltage applied between the power terminal HV of the IPM and the ground terminal GND as an amplitude is generated on the output terminal OUT of the IPM connected to the reference power terminal Vs.

The reason why the pulse generating circuit 31 and the RS flip-flop 34 are used in the conventional circuit structure illustrated in FIG. 8 is to suppress the power consumption on the high-side circuit 36 as much as possible and to keep the output capability of the inverter 35, since the bootstrap circuit has a limitation on power to be supplied to the capacitor 9.

However, the conventional circuit structure has a problem that the input of the RS flip-flop 34 is liable to malfunction to noise. Under the condition with a lot of noise such as the high-side circuit 36, a measure against noise is required. In view of this problem, Patent Document 1 proposes a circuit structure in which a filter configured with a logical circuit is provided in front of the RS flip-flop to prevent the malfunction caused by noise.

PRIOR ART DOCUMENT

Patent Document

Patent Document 1: Japanese Unexamined Patent Publication No. 2011-109843

DISCLOSURE OF THE INVENTION

Problems to be Solved by the Invention

However, since high dv/dt current is generated on the output terminal of the inverter circuit, it is impossible to perfectly prevent the malfunction of the input terminal of the RS flip-flop in the high-side circuit, the malfunction being caused by noise due to capacitive coupling with not only the output terminal of the inverter circuit but also the entire high-side circuit. When SiCFET or GaNFET that can realize high-speed switching is used as the switching element, a higher dv/dt current is generated. Therefore, when such high-speed switching element is used, it is predicted that the prevention of the malfunction by noise becomes further difficult.

The present invention is accomplished in view of the above-mentioned problems, and aims to provide a level shift circuit that has low possibility of malfunction caused by noise, and that can operate with low power.

Means for Solving the Problems

To achieve the object, the present invention provides a level shift circuit that outputs an output signal obtained by shifting a signal level of an input signal, the level shift circuit including: a first current control element that uses the input signal or a signal having a phase same as a phase of the input signal as a first gate input, and controls an amount of current flowing through an output terminal depending on a voltage level of the first gate input; a second current control element that uses a signal having a phase opposite to the phase of the input signal as a second gate input, and controls an amount of current flowing through an output terminal depending on a voltage level of the second gate input; a first resistance element having one end connected to a shift level power terminal that supplies an output voltage of the output signal on a high level, and having the other end connected to the output terminal of the first current control element; a second resistance element having one end connected to the shift level power terminal, and having the other end connected to the output terminal of the second current control element; a comparator including a pair of differential input terminals, one of which being connected to the output terminal of the first current control element, and the other of which being connected to the output terminal of the second current control element, the comparator generating the output signal by amplifying a voltage difference between the pair of the differential input terminals; and a current control circuit that controls an amount of first current flowing through the first current control element via the first resistance element and an amount of second current flowing through the second current control element via the second resistance element in synchronization with a rising and a falling of a signal level of the input signal.

In addition, in the level shift circuit having the above feature, preferably, the first current control element is configured of a first MOSFET having a gate to which the first gate input is inputted and having a drain as the output terminal of the first current control element, the second current control element is configured of a second MOSFET having a gate to which the second gate input is inputted and having a drain as the output terminal of the second current control element, and the level shift circuit includes a current generating circuit that has either a first circuit structure independently generating the first current and the second current, or a second circuit structure generating third current obtained by adding the first current and the second current. When the current generating circuit has the first circuit structure, a first current output terminal of the current generating circuit outputting the first current and a source of the first MOSFET are connected to each other, a second current output terminal of the current generating circuit outputting the second current and a source of the second MOSFET are connected to each other, and the current control circuit increases or decreases the first current and the second current in synchronization with the rising and the falling of the signal level of the input signal. And when the current generating circuit has the second circuit structure, a current output terminal of the current generating circuit outputting the third current and the sources of the first and second MOSFETs are connected to each other, and the current control circuit increases or decreases the third current in synchronization with the rising and the falling of the signal level of the input signal.

In addition, in the level shift circuit having the above feature, preferably, when the current generating circuit has the first circuit structure, during a certain period of time after the rising and the falling of the signal level of the input signal, the current control circuit increases each of the first current and the second current more than a corresponding stationary value of the first and second currents in a period of time other than the certain period of time. And when the current generating circuit has the second circuit structure, during the certain period of time, the current control circuit increases the third current more than a stationary value of the third current in a period of time other than the certain period of time.

In addition, in the level shift circuit having the above feature, preferably, the current control circuit detects the rising and the falling of the signal level of the input signal to generate a pulse signal whose signal level is changed in the certain period of time, and increases or decreases the amount of output current generated by the current generating circuit depending on the signal level of the pulse signal.

Effect of the Invention

The level shift circuit having the above-mentioned features can control a current amount in synchronization with the rising and falling of the signal level of the input signal respectively, thereby being capable of reducing power consumption without using an RS flip-flop that is more likely to have malfunction caused by noise.

BRIEF DESCRIPTION OF THE DRAWINGS

FIG. 10 is a signal waveform chart of an input signal and first and second pulses, which indicate the operation of the pulse generating circuit illustrated in FIG. 9.

BEST MODES FOR CARRYING OUT THE INVENTION

Figure 8:
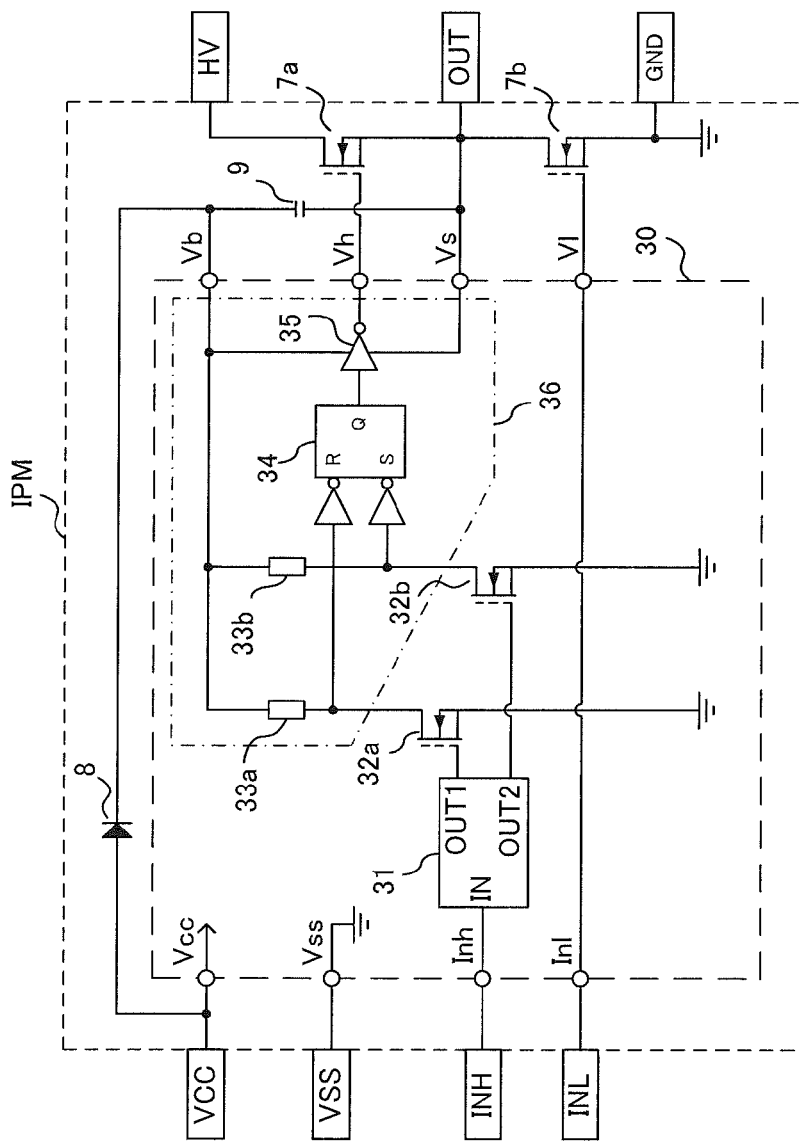
FIG. 8 is a circuit diagram illustrating an example of a circuit structure of an inverter circuit including a conventional level shift circuit.

Embodiments of a level shift circuit according to the present invention (hereinafter referred to as "present invention circuit", as appropriate) will be described below with reference to the drawings. The case where the present invention circuit is applied to a driver IC of an inverter circuit illustrated in FIG. 8 will be described below. However, the driver IC may singly be used without being incorporated into an IPM, and the present invention circuit may be used as an individual component, not as the driver IC. In the present invention circuit described in each embodiment below, same reference numerals are given to the same components (circuit elements, nodes, and terminals), and the same reference numerals are also given to the same components in the IPM of the conventional inverter circuit illustrated in FIG. 8, in order to make the understanding of the description easier.

First Embodiment

Figure 1:
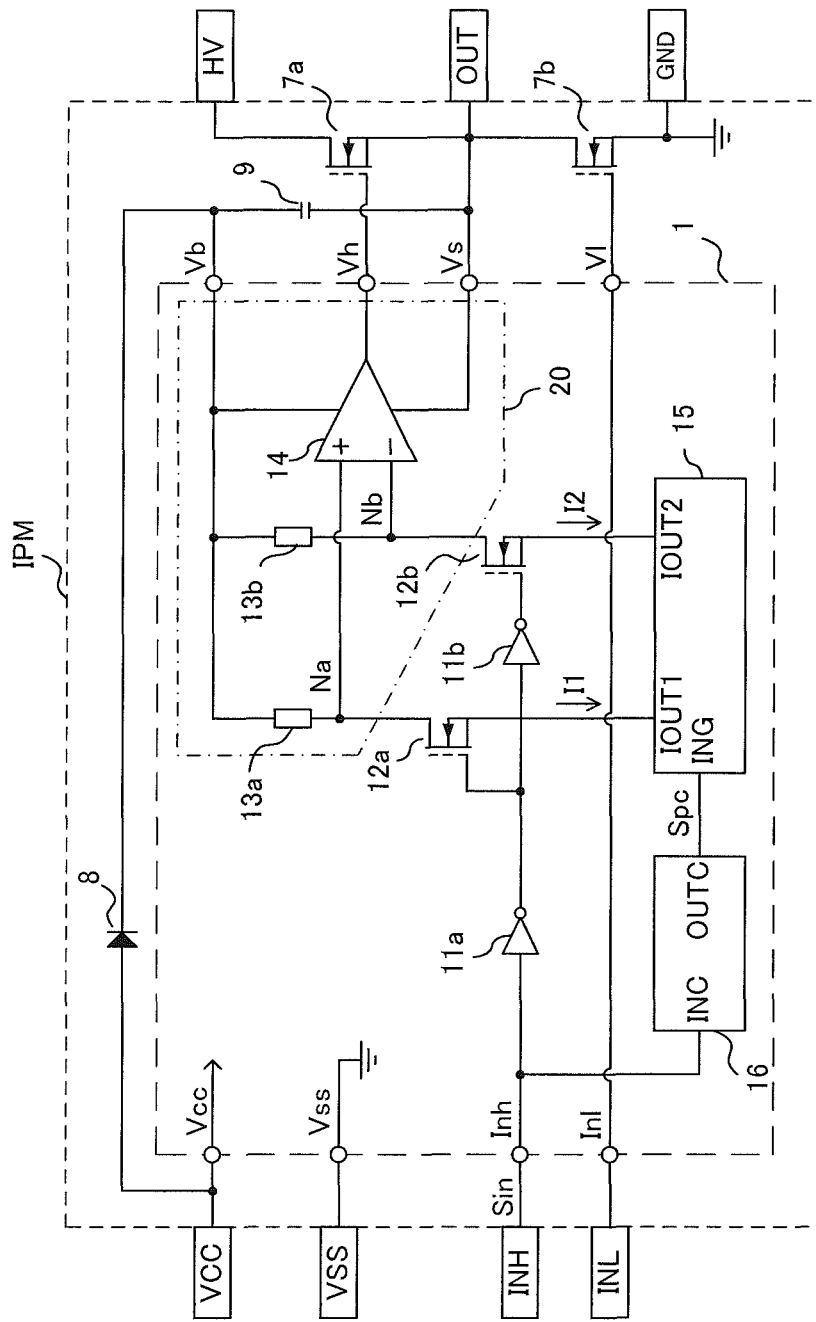
FIG. 1 is a circuit diagram illustrating an example of a circuit structure of a level shift circuit according to a first embodiment of the present invention.

FIG. 1 illustrates one example of a circuit structure of an IPM which is used in an inverter circuit and includes a driver IC 1 constituting the present invention circuit according to the first embodiment. The driver IC 1, n-type MOSFETs 7a and 7b, a diode 8, and a capacitor 9 constitute the IPM.

As illustrated in FIG. 1, the driver IC 1 includes two inverters 11a and 11b, a pair of n-type MOSFETs 12a and 12b (corresponding to a current control element), a pair of resistance elements 13a and 13b, a comparator 14, a current generating circuit 15, and a current control circuit 16. Like the driver IC 30 illustrated in FIG. 8, the driver IC 1 also includes a power terminal Vcc and a ground terminal Vss which are externally supplied, a control input terminal Inh of a high-side circuit 20, a control input terminal Inl on a low-side, a positive voltage power terminal Vb (corresponding to a shift level power terminal), a reference power terminal Vs, and an output terminal Vh of the high-side circuit 20, and an output terminal Vl on the low-side.

An input of the inverter 11a is connected to the control input terminal Inh, an output of the inverter 11a is connected to an input of the inverter 11b and a gate of the MOSFET 12a, and an output of the inverter 11b is connected to a gate of the MOSFET 12b. One end of each of the resistance elements 13a and 13b is connected to the positive voltage power terminal Vb, the other end of the resistance element 13a is connected to a drain of the MOSFET 12a and a non-inverting input of the comparator 14, the other end of the resistance element 13b is connected to a drain of the MOSFET 12b and an inverting input of the comparator 14, a source of the MOSFET 12a is connected to a first current output terminal IOUT1 of the current generating circuit 15, and a source of the MOSFET 12b is connected to a second current output terminal IOUT2 of the current generating circuit 15. An output of the comparator 14 is connected to the output terminal Vh. The voltage between the positive voltage power terminal Vb and the reference power terminal Vs is applied as a power-supply voltage of the comparator 14. An input terminal INC of the current control circuit 16 is connected to the control input terminal Inh, and an output terminal OUTC of the current control circuit 16 is connected to an input terminal ING of the current generating circuit 15. In the present embodiment, the pair of the n-type MOSFETs 12a and 12b and the pair of the resistance elements 13a and 13b have the same electric property for each other. The resistance elements 13a and 13b may be made of any materials and may have any structures, so long as they cause a voltage drop by electric current flowing through them. In addition, the resistance elements 13a and 13b may not necessarily be a single element.

Figure 2:
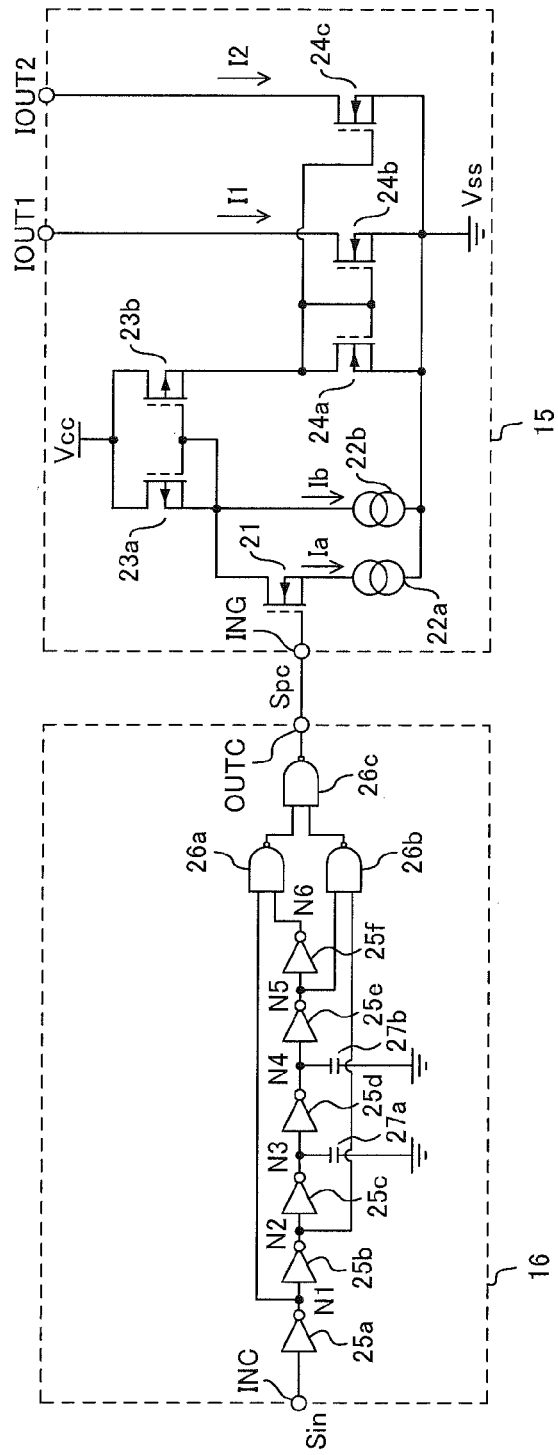
FIG. 2 is a circuit diagram illustrating an example of circuit structures of a current generating circuit and a current control circuit used in the level shift circuit illustrated in FIG. 1.

The configurations of the current generating circuit 15 and the current control circuit 16 will be described with reference to FIG. 2. FIG. 2 is a circuit diagram illustrating one example of a circuit structure of the current generating circuit 15 and a circuit structure of the current control circuit 16. As illustrated in FIG. 2, the current generating circuit 15 includes an n-type MOSFET 21, current circuits 22a and 22b, p-type MOSFETs 23a and 23b constituting a first current mirror circuit, and n-type MOSFETs 24a, 24b, and 24c constituting a second current mirror circuit. One end of each of the current circuits 22a and 22b is connected to the ground terminal Vss, and the other end of the current circuit 22a is connected to a source of the MOSFET 21. A drain of the MOSFET 21 and the other end of the current circuit 22b are connected to an input node of the first current mirror circuit in which a drain of the MOSFET 23a and each gate of the MOSFETs 23a and 23b are connected to each other, and each source of the MOSFETs 23a and 23b is connected to the power terminal Vcc. A drain of the MOSFET 23b that is an output node of the first current mirror circuit is connected to an input node of the second current mirror circuit in which a drain of the MOSFET 24a and each gate of the MOSFETs 24a, 24b, and 24c are connected to one another, and each source of the MOSFETs 24a, 24b, and 24c is connected to the ground terminal Vss. A drain of the MOSFET 24b is connected to a first current output terminal IOUT1, and a drain of the MOSFET 24c is connected to a second current output terminal IOUT2.

Figure 3:
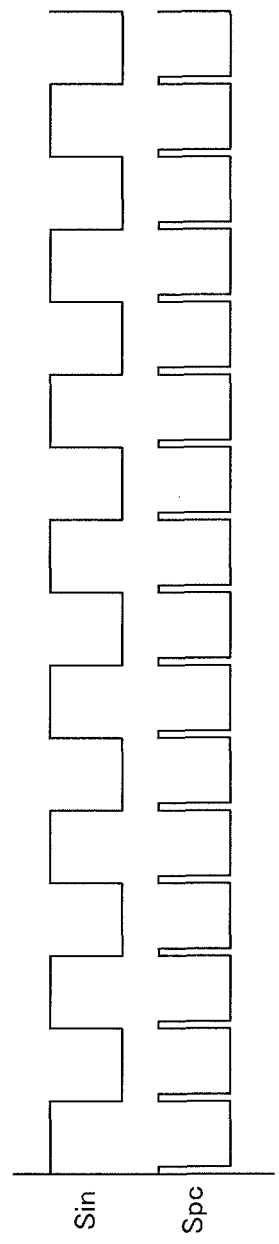
FIG. 3 is a signal waveform chart of a control input signal Sin and a pulse signal Spc, which indicate an operation of the current control circuit.

As illustrated in FIG. 2, the current control circuit 16 includes six cascade-connected inverters 25a, 25b, 25c, 25d, 25e, and 25f, three NAND circuits 26a, 26b, and 26c, and two capacitors 27a and 27b for setting a pulse width. An input of the head inverter 25a is connected to the input terminal INC. When an output node of each of the inverters 25a, 25b, 25c, 25d, 25e, and 25f is defined as N1, N2, N3, N4, N5, and N6 in order from head to tail, one end of each of the capacitors 27a and 27b is grounded, the other ends of the capacitors 27a and 27b are respectively connected to the nodes N3 and N4, the nodes N1 and N6 are connected to two inputs of the NAND circuit 26a, the nodes N2 and N5 are connected to two inputs of the NAND circuit 26b, outputs of the NAND circuits 26a and 26b are connected to two inputs of the NAND circuit 26c, respectively, and an output of the NAND circuit 26c is connected to an output terminal OUTC. As illustrated in FIG. 3, the current control circuit 16 outputs a pulse signal Spc outputted in synchronization with a rising and a falling of a control input signal Sin inputted to the input terminal INC.

Figure 9:
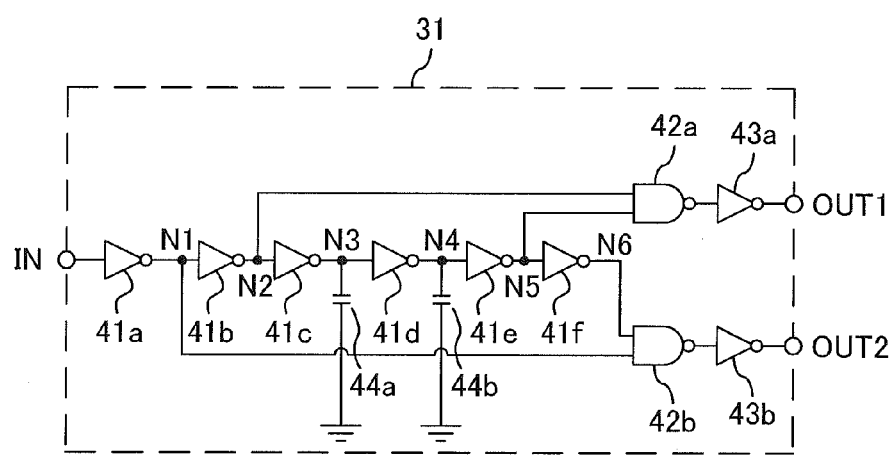
FIG. 9 is a circuit diagram illustrating an example of a circuit structure of a pulse generating circuit used in the conventional level shift circuit illustrated in FIG. 8.

The pulse signal Spc is a pulse signal corresponding to an OR of first and second pulses outputted from the pulse generating circuit 31 illustrated in FIG. 9. Current amounts of current I1 and I2 outputted from the respective two current output terminals IOUT1 and IOUT2 in the current generating circuit 15 are controlled by the pulse signal Spc. In the present embodiment, the input terminal INC of the current control circuit 16 is connected to the control input terminal Inh. However, instead of this, the input terminal INC may be connected to either one of the outputs of two inverters 11*a* and 11*b*. In this configuration, the similar pulse signal Spc can be generated.

The operation of the driver IC 1 will next be described. The MOSFET 21 in the current generating circuit 15 is in ON state when the pulse signal Spc is in a high level, so that the total of the current Ia flowing in the current circuit 22*a* and the current Ib flowing in the current circuit 22*b* (Ia+Ib) are simultaneously inputted to the first current mirror circuit. On the other hand, the MOSFET 21 is in OFF state when the pulse signal Spc is in a low level, so that only the current Ib flowing in the current circuit 22*b* is inputted to the first current mirror circuit. When current mirror ratios of the first and second current mirror circuits are defined as m1 and m2, the output currents I1 and I2 become m1×m2×(Ia+Ib) at the high level of the pulse signal Spc, and become m1×m2×Ib at the low level of the pulse signal Spc. Therefore, the output currents I1 and I2 from the current generating circuit 15 increase by (Ia+Ib)/Ib times the current value during a stationary period (the period when the pulse signal Spc is in low level) only during a certain period of time (the period when the pulse signal Spc is in high level) after the input signal Sin inputted to the control input terminal Inh is changed from a low level to a high level and from a high level to a low level In the present embodiment, the magnification (Ia+Ib)/Ib is set as 10 times, for example.

When the input signal Sin is changed from the low level to the high level, the gate level of the MOSFET 12*a* is changed from the high level to the low level, the gate level of the MOSFET 12*b* is changed from the low level to the high level, the MOSFET 12*a* is changed from the ON state to the OFF state, and the MOSFET 12*b* is changed from the OFF state to the ON state. Thus, a node Na connected to the non-inverting input of the comparator 14 is charged to the high voltage that is supplied to the positive voltage power terminal Vb via the resistance element 13*a* with its level being shifted, while a node Nb connected to the inverting input of the comparator 14 is discharged to the ground potential by the output current I2 from the current generating circuit 15 via the MOSFET 12*b*. Here, in the certain period of time just after the input signal Sin is changed from the low level to the high level, the current value of the output current I2 is multiplied. Therefore, the discharge of the node Nb is accelerated in the certain period of time, so that the potential of the node Nb rapidly decreases. Accordingly, the polarity of the potential difference between the node Na and the node Nb is inverted in a short period, whereby the output of the comparator 14 is changed from the low level (equal to the level of the reference power terminal Vs) to the high level (equal to the level of the positive voltage power terminal Vb) to bring the MOSFET 7*a* in the ON state. When the certain period of time elapses after the input signal Sin is changed from the low level to the high level, the current value of the output current I2 decreases to the value in the stationary period. However, since the gate levels of the MOSFETs 12*a* and 12*b* are the same, the polarity of the potential difference between the node Na and the node Nb is maintained, although the absolute value of the potential difference is decreased from the value at the end point of the certain period of time. Accordingly, the output of the comparator 14 is kept to be high level.

When the input signal Sin is changed from the high level to the low level, the gate level of the MOSFET 12*a* is changed from the low level to the high level, the gate level of the MOSFET 12*b* is changed from the high level to the low level, the MOSFET 12*a* is changed from the OFF state to the ON state, and the MOSFET 12*b* is changed from the ON state to the OFF state. Thus, the node Nb connected to the inverting input of the comparator 14 is charged to the high voltage that is supplied to the positive voltage power terminal Vb via the resistance element 13*a* with its level being shifted, while the node Na connected to the non-inverting input of the comparator 14 is discharged to the ground potential by the output current I1 from the current generating circuit 15 via the MOSFET 12*a*. Here, in the certain period of time just after the input signal Sin is changed from the high level to the low level, the current value of the output current I1 is multiplied. Therefore, the discharge of the node Na is accelerated in the certain period of time, so that the potential of the node Na rapidly decreases. Accordingly, the polarity of the potential difference between the node Na and the node Nb is inverted in a short period, whereby the output of the comparator 14 is changed from the high level (equal to the level of the positive voltage power terminal Vb) to the low level (equal to the level of the reference power terminal Vs) to bring the MOSFET 7*a* in the OFF state. When the certain period of time elapses after the input signal Sin is changed from the high level to the low level, the current value of the output current I1 decreases to the value in the stationary period. However, since the gate levels of the MOSFETs 12*a* and 12*b* are the same, the polarity of the potential difference between the node Na and the node Nb is maintained, although the absolute value of the potential difference is decreased from the value at the end point of the certain period of time. Accordingly, the output of the comparator 14 is kept to be low level.

According to the driver IC 1 constituting the present circuit, the level-shifted signal having the phase same as the phase of the input signal Sin inputted to the control input terminal Inh is outputted from the comparator 14. According to the present invention circuit, the discharge of the node Na or the node Nb is accelerated upon the change of the signal level of the input signal Sin, whereby a response time until the output signal with the same phase is outputted from the comparator 14 can be shortened. In addition, after the charging and discharging of the node Na and the node Nb are completed, the output state of the comparator 14 can be maintained with low current, whereby the power consumption of the driver IC 1 can be reduced. In the present invention circuit, the comparator of the differential circuit, which has resistance to noise with the same phase such as dv/dt current, is used instead of the RS flip-flop that is sensitive to malfunction caused by noise. Accordingly, the resistance to malfunction caused by noise can significantly be enhanced.

Second Embodiment

Figure 4:
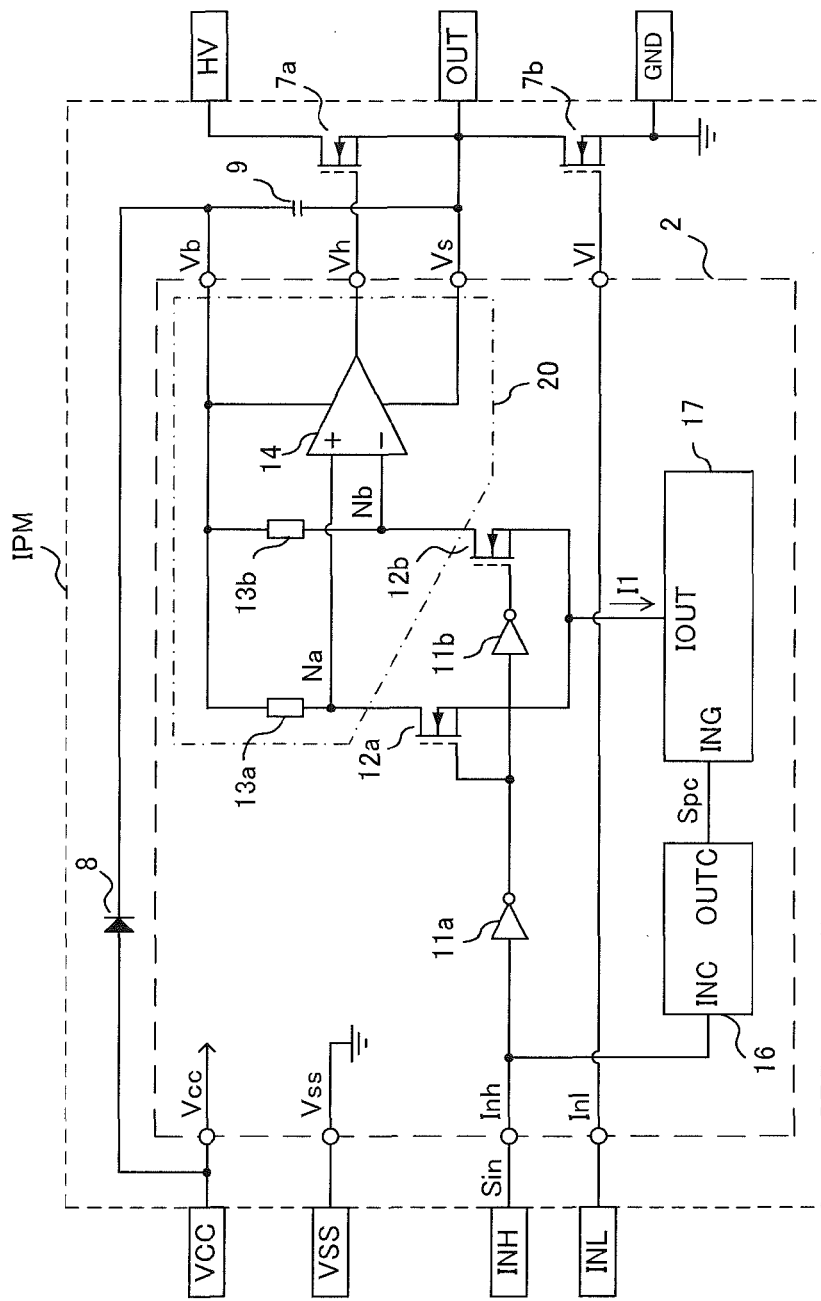
FIG. 4 is a circuit diagram illustrating an example of a circuit structure of a level shift circuit according to a second embodiment of the present invention.

FIG. 4 illustrates one example of a circuit structure of an IPM which is used in an inverter circuit and includes a driver IC 2 constituting the present invention circuit according to the second embodiment. The driver IC 2, MOSFETs 7*a* and 7*b*, a diode 8, and a capacitor 9 constitute the IPM.

As illustrated in FIG. 4, the driver IC 2 includes two inverters 11*a* and 11*b*, a pair of n-type MOSFETs 12*a* and 12*b*, a pair of resistance elements 13*a* and 13*b*, a comparator 14, a current generating circuit 17, and a current control circuit 16.

The circuit structure is the same as that of the first embodiment, except that the circuit structure of the current generating circuit 17 in the second embodiment is different from the structure of the current generating circuit 15 in the first embodiment. Therefore, the redundant description will not be repeated.

Figure 5:
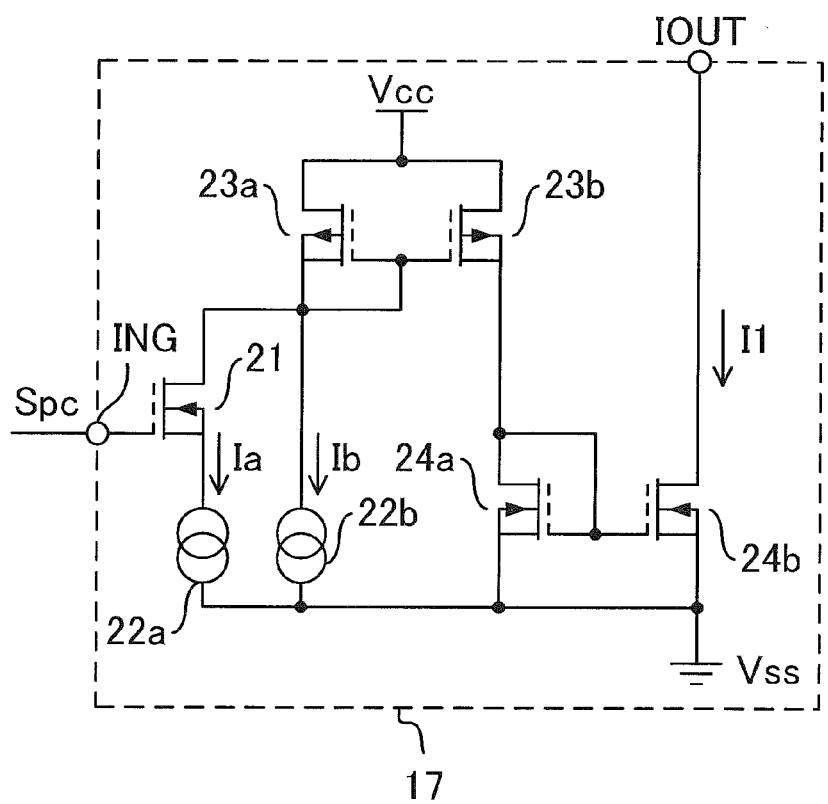
FIG. 5 is a circuit diagram illustrating an example of a circuit structure of a current generating circuit used in the level shift circuit illustrated in FIG. 4.

The circuit structure of the current generating circuit 17 will be described with reference to FIG. 5. FIG. 5 is a circuit diagram illustrating one example of the circuit structure of the current generating circuit 17. As illustrated in FIG. 5, the current generating circuit 17 includes an n-type MOSFET 21, current circuits 22a and 22b, p-type MOSFETs 23a and 23b constituting a first current mirror circuit, and n-type MOSFETs 24a and 24b constituting a second current mirror circuit. The current generating circuit 17 is different from the current generating circuit 15 of the first embodiment in that the second current mirror circuit includes only the n-type MOSFETs 24a and 24b, the MOSFET 24c is eliminated, and the current to be outputted is only the output current I1. The current generating circuit 17 has only one current output terminal IOUT. Accordingly, as in the current generating circuit 15, the output current I1 becomes m1×m2×(Ia+Ib) at the high level of the pulse signal Spc, and becomes m1×m2×Ib at the low level of the pulse signal Spc. Therefore, the output current I1 increases by (Ia+Ib)/Ib times the current value during a stationary period (the period when the pulse signal Spc is in low level) only during a certain period of time (the period when the pulse signal Spc is in high level) after the input signal Sin inputted to the control input terminal Inh is changed from a low level to a high level and from a high level to a low level.

Since the current output terminal IOUT in the current generating circuit 17 is only one in the second embodiment, the source of each of the MOSFETs 12a and 12b is commonly connected to the first current output terminal IOUT in the current generating circuit 17. Therefore, a circuit constituted by the pair of MOSFETs 12a and 12b, the pair of resistance elements 13a and 13b, and the current generating circuit 17 functions as a comparator preceding the comparator 14.

Although the output currents I1 and I2 are commonalized in the second embodiment, the operation of the driver IC 2 according to the second embodiment and its effect are the same as those of the driver IC 1 according to the first embodiment. Therefore, the redundant description will not be repeated.

Another Embodiment

Another embodiment of the present invention circuit will be described below.

In each of the embodiments described above, one example of preferable embodiments of the present invention circuit has been described in detail. The circuit structure of the present invention circuit is not limited to the above-mentioned embodiments, and various modifications are possible without departing from the scope of the present invention.

For example, in the drivers IC 1 and IC 2 in each of the embodiments described above, the current values of the output currents I1 and I2 outputted from the current generating circuit 15 or the current value of the output current I1 outputted from the current generating circuit 17 are controlled, by the pulse signal Spc outputted from the current control circuit 16, to be increased or decreased according to a signal level of the pulse signal Spc. However, a plurality of current paths may be provided between the MOSFETs 12a and 12b and the current generating circuit 15, and the conduction of these current paths may be controlled depending on the signal level of the pulse signal Spc.

Figure 6:
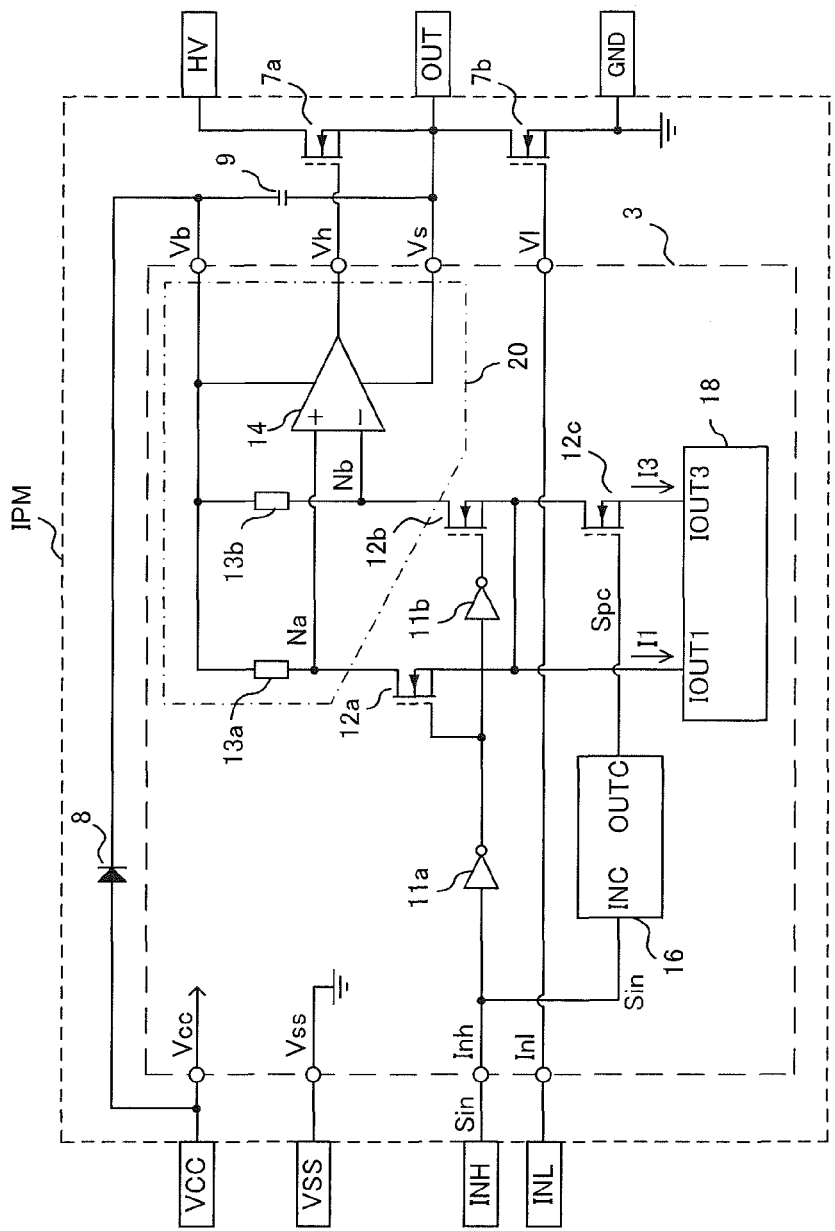
FIG. 6 is a circuit diagram illustrating an example of a circuit structure of a level shift circuit according to another embodiment of the present invention.

Specifically, as illustrated in FIG. 6, for example, a driver IC 3 includes two inverters 11a and 11b, a pair of n-type MOSFETs 12a and 12b, an n-type MOSFET 12c, a pair of resistance elements 13a and 13b, a comparator 14, a current generating circuit 18, and a current control circuit 16.

Figure 7:
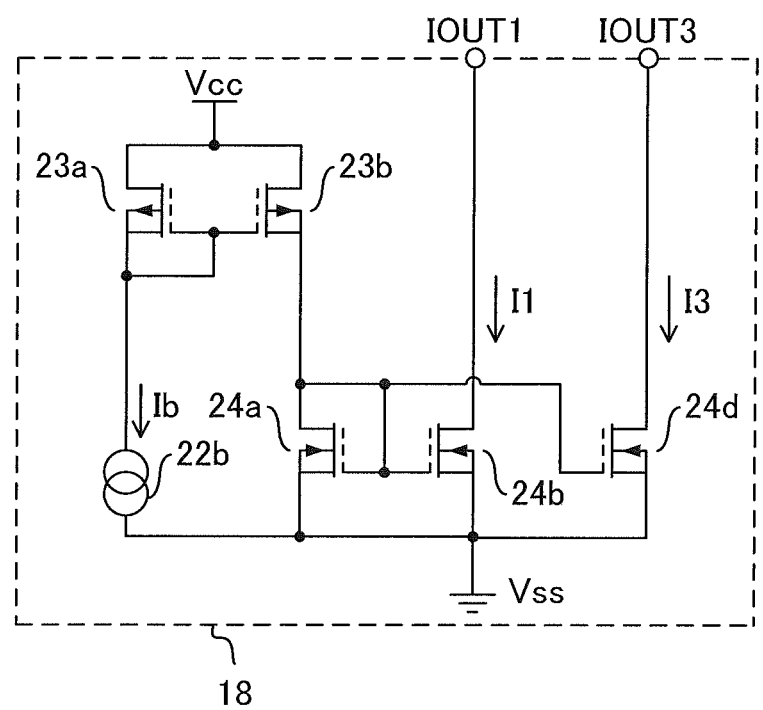
FIG. 7 is a circuit diagram illustrating an example of a circuit structure of a current generating circuit used in the level shift circuit illustrated in FIG. 6.

As illustrated in FIG. 7, the current generating circuit 18 includes a current circuit 22b, p-type MOSFETs 23a and 23b constituting a first current mirror circuit, and n-type MOSFETs 24a, 24b, and 24d constituting second and third current mirror circuits. The MOSFETs 24a and 24b constitute the second current mirror circuit, and the MOSFETs 24a and 24d constitute the third current mirror circuit. One end of the current circuit 22b is connected to the ground terminal Vss, the other end of the current circuit 22b is connected to an input node of the first current mirror circuit in which a drain of the MOSFET 23a and each gate of the MOSFETs 23a and 23b are connected to each other, and each source of the MOSFETs 23a and 23b is connected to the power terminal Vcc. A drain of the MOSFET 23b that is an output node of the first current mirror circuit is connected to an input node of the second and third current mirror circuits in which a drain of the MOSFET 24a and each gate of the MOSFETs 24a, 24b, and 24d are connected to one another, and each source of the MOSFETs 24a, 24b, and 24d is connected to the ground terminal Vss. A drain of the MOSFET 24b is connected to the first current output terminal IOUT1, and a drain of the MOSFET 24d is connected to a third current output terminal IOUT3.

The driver IC 3 has a circuit structure in which the sources of the MOSFETs 12a and 12b are respectively connected to the first current output terminal IOUT1 and the drain of the MOSFET 12c, the source of the MOSFET 12c is connected to the third current output terminal IOUT3, and the pulse signal Spc is inputted to the gate of the MOSFET 12c. The other circuit structure of the driver IC 3 is the same as that of the drivers IC 1 and 2 in the first and second embodiments, except for the circuit structure described above and the circuit structure of the current generating circuit 18.

When the current mirror ratios of the first to third current mirror circuits are respectively defined as m1, m2, and m3, and the ratio m3/m2 between the current mirror ratios m2 and m3 is set to be equal to the current ratio Ia/Ib between the current circuits 22a and 22b in the first and second embodiments, the output current I1 becomes m1×m2×Ib that is the same as the current value of the output currents I1 and I2 in the first and second embodiments when the pulse signal Spc is in the low level, and the output current I3 becomes m1×m3×Ib (=m1×m2×Ia). Therefore, the total of the output current I1 and the output current I3 becomes m1×m2×(Ia+Ib) that is the same as the current value of the of the output currents I1 and I2 in the first and second embodiments when the pulse signal Spc is in the high level.

The circuit structure described above executes the control in which, when the pulse signal Spc is in the high level, the MOSFET 12c is in the ON state, so that both the output current I1 and the output current I3 flow through the MOSFETs 12a and 12b, and when the pulse signal Spc is in the low level, only the output current I1 flows.

Various modifications are also possible to the circuit structure according to the embodiment illustrated in FIGS. 6 and 7. For example, each of the MOSFETs 12a and 12b may be configured of two or more MOSFET parallel circuits, wherein one of each of pairs of the MOSFETs may be connected to the first current output terminal IOUT1, while the other of each of pairs may be connected to the third current output terminal IOUT3 via the MOSFET 12c.

Specifically, in the present invention circuit, the first MOSFET having an input signal or a signal with a phase same as the phase of the input signal as a gate input, and the second MOSFET having a signal with a phase opposite to the phase of the input signal as a gate input are not limited to a single MOSFET, but may be a MOSFET circuit including two or more MOSFETs. In addition, a MOSFET having the pulse signal Spc as a gate input may be incorporated into the MOSFET circuit.

Any elements other than MOSFET may be employed for the MOSFETs 12a and 12b, so long as they are current control elements controlling an amount of current flowing through a terminal (corresponding to the output terminal) connected to the resistance elements 13a and 13b and the input terminal of the comparator depending on a voltage level of the gate input. In addition, the MOSFETs 12a and 12b are not necessarily a single element.

INDUSTRIAL APPLICABILITY

The level shift circuit according to the present invention can be used for a driver circuit that controls a high-side switching element, which is half-bridged and to which a high voltage is applied, from a control signal with a low voltage level, and can widely be used in a level shift to not only an inverter circuit but also to a circuit having a voltage difference.

EXPLANATION OF REFERENCES

1, 2, 3 level shift circuit (driver IC) according to present invention
7a, 7b n-type MOSFET
8 diode
9 capacitor
11a, 11b inverter
12a, 12b n-type MOSFET
13a, 13b resistance element
14 comparator
15, 17, 18 current generating circuit
16 current control circuit
20, 36 high-side circuit
21, 24a to 24d n-type MOSFET
23a, 23b p-type MOSFET
25a to 25f inverter
26a, 26b, 26c NAND circuit
27a, 27b capacitor
30 conventional level shift circuit (driver IC)
31 pulse generating circuit
32a, 32b n-type MOSFET
33a, 33b resistance
34 RS flip-flop
35, 41a to 41f, 43a, 43b inverter
42a, 42b NAND circuit
44a, 44b capacitor
Na node connected to non-inverting input of comparator
Nb node connected to inverting input of comparator
Inh control input terminal of driver IC on high-side
Inl control input terminal of driver IC on low-side
Vb positive-voltage power terminal of driver IC on high-side
Vcc power terminal of driver IC
Vh output terminal of driver IC on high-side
Vl output terminal of driver IC on low-side
Vs reference power terminal of driver IC on high-side
Vss ground terminal of driver IC
ING input terminal of current generating circuit
IOUT, IOUT1 to IOUT3 current output terminal of current generating circuit
INC input terminal of current control circuit
OUTC output terminal of current control circuit
GND ground terminal for output of IPM
HV high-voltage power terminal of IPM
INH control input terminal of IPM on high-side
INL control input terminal of IPM on low-side
OUT output terminal of IPM
VCC power terminal of IPM
VSS ground terminal of IPM
IN input terminal of pulse generating circuit
OUT1 first output terminal of pulse generating circuit
OUT2 second output terminal of pulse generating circuit
R reset terminal of RS flip-flop
S set terminal of RS flip-flop
Q output terminal of RS flip-flop

The invention claimed is:

1. A level shift circuit that outputs an output signal obtained by shifting a signal level of an input signal, the level shift circuit comprising:
a first current control element that uses the input signal or a signal having a phase same as a phase of the input signal as a first gate input, and controls an amount of current flowing through an output terminal depending on a voltage level of the first gate input;
a second current control element that uses a signal having a phase opposite to the phase of the input signal as a second gate input, and controls an amount of current flowing through an output terminal depending on a voltage level of the second gate input;
a first resistance element having one end connected to a shift level power terminal that supplies an output voltage of the output signal on a high level, and having the other end connected to the output terminal of the first current control element;
a second resistance element having one end connected to the shift level power terminal, and having the other end connected to the output terminal of the second current control element;
a comparator including a pair of differential input terminals, one of which being connected to the output terminal of the first current control element, and the other of which being connected to the output terminal of the second current control element, the comparator generating the output signal by amplifying a voltage difference between the pair of the differential input terminals; and
a current control circuit that controls an amount of first current flowing through the first current control element via the first resistance element and an amount of second current flowing through the second current control element via the second resistance element in synchronization with a rising and a falling of a signal level of the input signal.

2. The level shift circuit according to claim 1, wherein
the first current control element is configured of a first MOSFET having a gate to which the first gate input is inputted, and having a drain as the output terminal of the first current control element,
the second current control element is configured of a second MOSFET having a gate to which the second gate input is inputted, and having a drain as the output terminal of the second current control element, the level shift circuit includes a current generating circuit that has either a first circuit structure independently generating the first current and the second current, or a second circuit structure generating third current obtained by adding the first current and the second current, when the current generating circuit has the first circuit structure, a first current output terminal of the current generating circuit outputting the first current and a source of the first MOSFET are connected to each other, a second current output terminal of the current generating circuit outputting the second current and a source of the second MOSFET are connected to each other, and the current control circuit increases or decreases the first current and the second current in synchronization with the rising and the falling of the signal level of the input signal, and when the current generating circuit has the second circuit structure, a current output terminal of the current generating circuit outputting the third current and the sources of the first and second MOSFETs are connected to each other, and the current control circuit increases or decreases the third current in synchronization with the rising and the falling of the signal level of the input signal.

3. The level shift circuit according to claim 2, wherein when the current generating circuit has the first circuit structure, during a certain period of time after the rising and the falling of the signal level of the input signal, the current control circuit increases each of the first current and the second current more than a corresponding stationary value of the first and second currents in a period of time other than the certain period of time, and when the current generating circuit has the second circuit structure, during the certain period of time, the current control circuit increases the third current more than a stationary value of the third current in a period of time other than the certain period of time.

4. The level shift circuit according to claim 3, wherein the current control circuit detects the rising and the falling of the signal level of the input signal to generate a pulse signal whose signal level is changed in the certain period of time, and increases or decreases the amount of output current generated by the current generating circuit depending on the signal level of the pulse signal.

\* \* \* \* \*